United States Patent
Ueyanagi et al.

[11] Patent Number: 5,827,967
[45] Date of Patent: Oct. 27, 1998

[54] SEMICONDUCTOR ACCELEROMETER INCLUDING STRAIN GAUGES FORMING A WHEATSTONE BRIDGE AND DIFFUSION RESISTORS

[75] Inventors: Katsumichi Ueyanagi; Mutsuo Nishikawa, both of Kawasaki, Japan

[73] Assignees: Fuji Electric Co., Ltd., Kawasaki; Fujitsu Ten Limited, Kobe, both of Japan

[21] Appl. No.: 651,578

[22] Filed: May 22, 1996

[30] Foreign Application Priority Data

May 23, 1995 [JP] Japan ................................. 7-123896

[51] Int. Cl.⁶ ..................................................... G01P 15/12
[52] U.S. Cl. ......................................... 73/514.33; 73/1.38
[58] Field of Search .................... 324/514.16; 73/514.18, 73/514.21, 514.32, 510, 517 R, 514.33, 514.01, 1.38, 1.37, 726, 727, 720, 721; 338/3, 2; 307/308

[56] References Cited

U.S. PATENT DOCUMENTS

| | | | |
|---|---|---|---|
| 4,553,436 | 11/1985 | Hansson . | |
| 4,633,099 | 12/1986 | Tanabe | 307/308 |
| 4,641,539 | 2/1987 | Vilimek | 73/862.67 |
| 4,848,157 | 7/1989 | Kobayashi | 73/517 R |
| 5,103,667 | 4/1992 | Allen et al. . | |
| 5,251,485 | 10/1993 | Kondo | 73/517 R |

FOREIGN PATENT DOCUMENTS

| | | |
|---|---|---|
| 0 266 681 | 5/1988 | European Pat. Off. . |
| 0 524 855 | 1/1993 | France . |
| 59-99356 | 8/1984 | Japan . |
| 5-58140 | 5/1986 | Japan . |

Primary Examiner—Christine K. Oda
Attorney, Agent, or Firm—Spencer & Frank

[57] ABSTRACT

A semiconductor accelerometer having a sensor element which includes a support frame, a silicon mass, flexures connected to the support frame and the silicon mass, semiconductor strain gauges formed on the flexures, and a staggered arrangement of diffusion resistors for adjusting any offset value variation. Aluminum wiring is connected to the strain gauges to form a Wheatstone bridge circuit, and a housing is provided to cover the sensor element.

9 Claims, 10 Drawing Sheets

SEMICONDUCTOR ACCELEROMETER INCLUDING STRAIN GAUGES FORMING A WHEATSTONE BRIDGE AND DIFFUSION RESISTORS

BACKGROUND OF THE INVENTION

1. Field of the Invention

The present invention generally relates to an acceleration sensor (accelerometer) for sensing a change of velocity with respect to time. More specifically, the present invention is directed to a semiconductor accelerometer of the type which uses a semiconductor strain-gauge for constructing an acceleration-detecting circuit of a sensor element. The present invention also relates to a method for testing the characteristics of the sensor element mounted on the semiconductor accelerometer.

2. Description of Related Art

Heretofore, accelerometers have been used in many industrial fields and generally grouped into several types. In the field of automobiles, for example, the accelerometer has been used in the so-called airbag system for insuring the safety of a passenger on the occasion of a traffic accident. A slightly defective condition of the accelerometer in such system may exert an influence upon the passenger's life, so that the semiconductor-type accelerometer has been generally used in the above system because of its operation with a high degree of reliability.

The semiconductor-type accelerometer performs detection through the use of the variation in resistance caused by the effect of expansion and contraction of a semiconductor material. In this case, silicon has been commonly used as the semiconductor material because of its high rate of gauge. The semiconductor-type accelerometer comprises a base plate made of glass and a silicon detector (hereinafter, also referred to as a sensor element) molded in one piece by processing the silicon by a micro-machining technique.

Referring now to FIG. 1 and FIGS. 2A–2D, the conventional semiconductor-type accelerometer will be described.

FIG. 1 is a sectional view of a conventional semiconductor accelerometer for briefly illustrating a sensor element formed thereon. As shown in FIG. 1, the sensor element 400 is formed almost in the shape of the letter E in cross section by integrally molding a solid made of silicon which comprises flexures 401, a weight 403, and a frame 404. In addition, each of the thin-walled flexures 401 acts as a bridge between thick-walled frame 404 and the weight 403. Furthermore, there is a plurality of semiconductor strain gauges 402 formed on a surface of each flexure 401. These semiconductor strain gauges 402 are connected with each other by means of wiring (not shown) to form a Wheatstone bridge circuit, and also a passivation film 405 is placed over the two flexures 401. The passivation film 405 is responsible for the protection of electrical wiring and gauges from physical stimuli or stresses, such as friction and temperature.

For more consideration, a concrete example of the conventional semiconductor accelerometer is disclosed in, for example, U.S. Pat. No. 5,103,667.

Incidentally, the above semiconductor accelerometer having a Wheatstone bridge circuit formed by the semiconductor strain gauges 402 and the wiring may cause offset as a result of variations in the properties of the strain gauges. In the process of forming the semiconductor strain gauges 402, there are several problems which arise which can result in variations in the finished dimensions of the strain gauge. These problems are caused by the conditions which exist during exposing of a resist pattern and diffusion of a strain gauge. Also, the thermal expansion coefficient of the passivation film 405 is different from that of the silicon, so that the surface of a flexure 401 may be warped, causing the offset that affects the characteristics of the sensor. Hereinafter, the term "offset" means that the sensor generates erroneous signals that provide an incorrect acceleration measurement.

For this kind of offset, the conventional semiconductor accelerometer has an amplification IC chip 410 connected with the semiconductor sensor element 400 through the wiring 420. The amplification IC chip 410 is responsible for amplifying the sensor signal and determining frequency response. It is possible to regulate the above offset by placing offset-regulating resistors onto the amp-processing IC chip 410 and modifying their wiring.

Recent years have seen significant demands in cost effective and miniaturized semiconductor accelerometers, so that for example the accelerometers in FIGS. 2A to 2D implemented in IC packages have been developed.

FIG. 2A shows an accelerometer 510 as an electronic component with the shape of a rectangle, while FIG. 2B shows an accelerometer 520 as a component with the shape of a cylinder. As shown in FIGS. 2C and 2D, each of the semiconductors has a plurality of signal wires 540 at both ends or one end thereof. These signal wires 540 are connected to a printed circuit base plate 530.

In the following description with reference to FIG. 3A and 3B, we will explain a method for making an assessment of the aforementioned semiconductor-type accelerometer and a device for performing such method.

FIG. 3A and FIG. 3B illustrate the method for making the assessment, wherein FIG. 3A is a schematic cross sectional view of the device while FIG. 3B shows wave forms of pick-up output and accelerometer output.

Among the characteristics of the semiconductor-type accelerometer, sensitivity and frequency response are main categories for making the assessment. In general, a sensor assembly 600 that contains a sensor element 610 and an amplification IC chip 620 is mechanically vibrated by a vibration-testing apparatus 630 to obtain the results, for example as shown in FIG. 3B. The above characteristics, such as sensitivity and frequency response, can be estimated by comparing an output signal 650 of an acceleration. pick-up 640 to an output signal 660 of the accelerometer.

However, the conventional semiconductor-type accelerometer has the following problems to be solved.

As the conventional semiconductor-type accelerometer is constructed so as to have typically a thin-walled flexure for increasing the sensitivity of the sensor element, the offset generated by the passivation film becomes large and results in large variations in the sensitivity of the accelerometer. To solve this problem, it is required to secure trimming-resistors over a wide range of the flexure's surface for regulating the offset. However, this kind of construction prevents miniaturization of the sensor. In the conventional semiconductor-type accelerometer shown in FIG. 2B and FIG. 2D, the accelerometer is generally installed on the printed circuit board 530 just as is the case with the typical electronic component. In general, however, the printed circuit board 530 is not rigid enough to endure the pressure applied as an acceleration, so that the board may be bent repeatedly under the process of acceleration. Depending on the direction of acceleration, furthermore, the signal wire 540 may be flexed. In FIG. 2B, for example, the circuit board 530 is flexed by an external force along the vertical direction as indicated by an arrow A and the circuit board 530 absorbs the external force applied on the accelerometer 510 (or 520) mounted thereon. In FIG. 2D, on the other hand, the circuit board 530 receives an external force along the horizontal direction as indicted by an arrow B. In this case, the circuit board 530 remains as it is but the signal wire 540 is flexed. This means that the signal wire 540 absorbs the external force applied on the accelerometer 510 (or 520). Accordingly, the acceleration to be correctly sensed can be absorbed by the circuit board 530 and the signal wire 540 because of their flexibility, resulting in unreliability of the sensor signal.

Furthermore, a requirement for the accelerometer to be installed in an automobile's air-bag system is that the acceleration of 20 G to 50 G should be estimated with an accuracy of better than several percent. However, the printed circuit board 530 or signal wire 540, which supports the accelerometer, is of low rigidity, so that their resonant mode causes a reduction in reliability of the sensor signal.

The conventional example shown in FIG. 3A and 3B is provided to illustrate two other problems. If the accelerometer is determined to be defective, the other components of the assembly also have no value because of their assembled construction, i.e., the accelerometer is installed in the assembly 600 prior to performing the estimation. The second problem is that the cost of manufacturing the accelerometers in mass production becomes high because of the requirement of introducing expensive vibration test machines.

SUMMARY OF THE INVENTION

An object of the present invention is to provide a semiconductor-type accelerometer with an excellent sensitivity, in which the accelerometer can be produced at a very low cost and by a mass production system, compared with the conventional one. In addition, the present invention aims at a method for conducting performance evaluations of a sensor element which is installed in that accelerometer.

In a first aspect of the present invention, there is provided a semiconductor accelerometer, comprising:

a sensor element having a support frame, a silicon mass, flexures connected to both the support flame and the silicon mass, and semiconductor strain gauges formed on the flexures, which are integrally processed;

an aluminum wiring connected with the strain gauges to form a Wheatstone bridge circuit; and a housing for covering the sensor element, wherein a staggered arrangement of diffusion resistors is provided in the sensor element.

The housing may have at least one portion to be connected to a sample under measurement.

The portion to be connected to a sample under measurement may be one selected from a group of a male thread, a female thread, and a combination of the male thread and the female thread.

In a second aspect of the present invention, there is provided a method for evaluating the characteristics of a semiconductor accelerometer, comprising the steps of:

applying a predetermined voltage between an electrode pad of the semiconductor accelerometer and a metal thin membrane of a device for applying electrostatic force to generate an artificial acceleration on the semiconductor accelerometer, and evaluating the artificial acceleration on the semiconductor accelerometer, wherein the device for applying electrostatic force is provided as an insulating material having a recess formed on a surface thereof, a metal thin film metalized on a surface of the recess, and a contact for taking an output from the metal thin film.

The semiconductor accelerometer may comprise:

a sensor element having a support frame, a silicon mass, flexures connected to both the support frame and the silicon mass, and semiconductor strain gauges formed on the flexures, which are integrally processed;

an aluminum wiring connected with the strain gauges to form a Wheatstone bridge circuit; and a housing for covering the sensor element, wherein a staggered arrangement of diffusion resistors is provided in the sensor element.

A method for evaluating the characteristics of a semiconductor accelerometer may further comprise the steps of:

positioning the metalized portion so as to face toward the silicon mass of the sensor element;

applying an alternating electrical current between the sensor element and the metalized portion to generate an electrostatic force to generate an acceleration of the sensor element; and evaluating a sensitivity of the sensor element.

A method for evaluating the characteristics of a semiconductor accelerometer may further comprise the steps of:

positioning the metalized portion so as to face toward the silicon mass of the sensor element;

applying a direct electric current with a variation of frequency thereof between the sensor element and the metalized portion to generate an electrostatic force to generate an acceleration of the sensor element; and evaluating both frequency characteristics and natural frequency of the sensor element.

BRIEF DESCRIPTION OF THE DRAWINGS

FIGS. 12A to 12D are diagrams illustrating the method for conducting performance evaluations of the accelerometer in accordance with the present invention, in which FIG. 12A is a schematic front view of the device for applying electrostatic force to the accelerometer, FIG. 12B is a cross-sectional view along the line 12B—12B and shows the condition just before attaching the accelerometer on the device for applying electrostatic force, FIG. 12C is a schematic sectional view of the accelerometer 300 being fixed on the device for applying electrostatic force; and FIG. 12D is a schematic sectional view of the accelerometer being placed on the ceramic base plate after making the assessment of the characteristics thereof.

DETAILED DESCRIPTION OF THE INVENTION

Referring to the attached figures, the preferred embodiments of the present invention will be explained.

<EXAMPLE 1>

Figure 1:
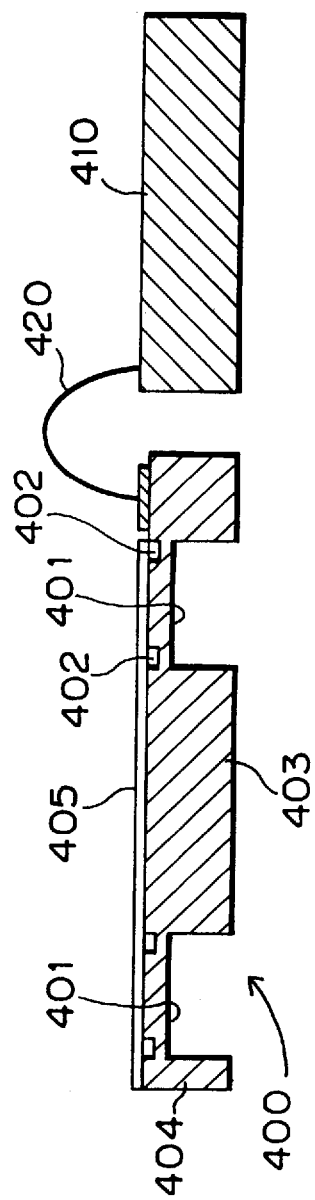
FIG. 1 is a sectional view of a conventional semiconductor-type accelerometer.
Figure 2A:
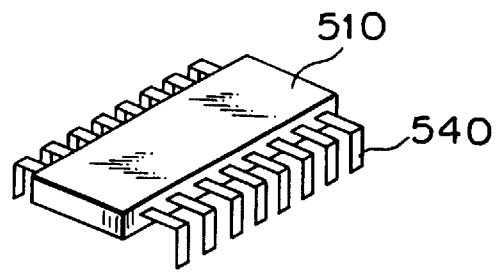
FIG. 2A is a perspective view of a conventional electronic-type accelerometer.
Figure 2B:
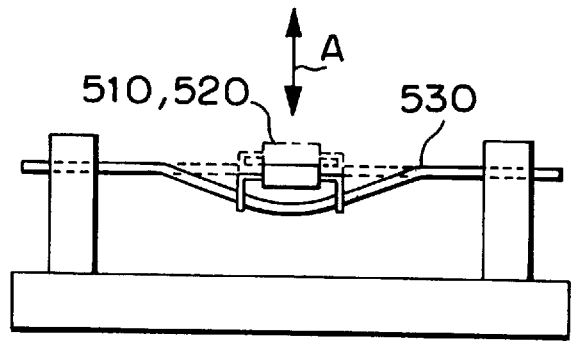
FIG. 2B is a side view of a conventional electronic-type accelerometer.
Figure 2C:
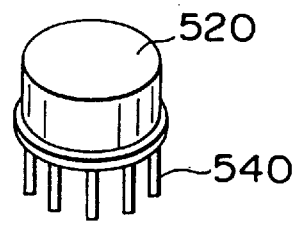
FIG. 2C is a perspective view of an accelerometer connected with a printed circuit base plate through a signal wire.
Figure 2D:
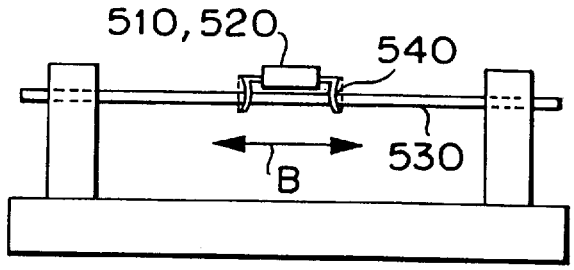
FIG. 2D is a sectional view of an accelerometer connected with a printed circuit base plate through a signal wire.
Figure 3A:
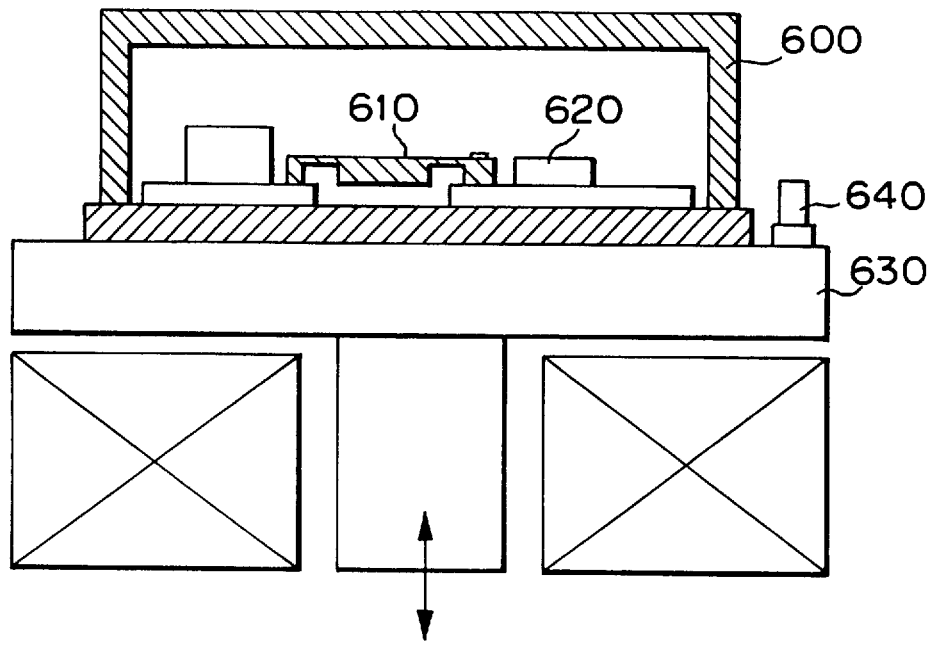
FIG. 3A is a conventional device for conducting performance evaluations of the semiconductor-type accelerometer.
Figure 3B:
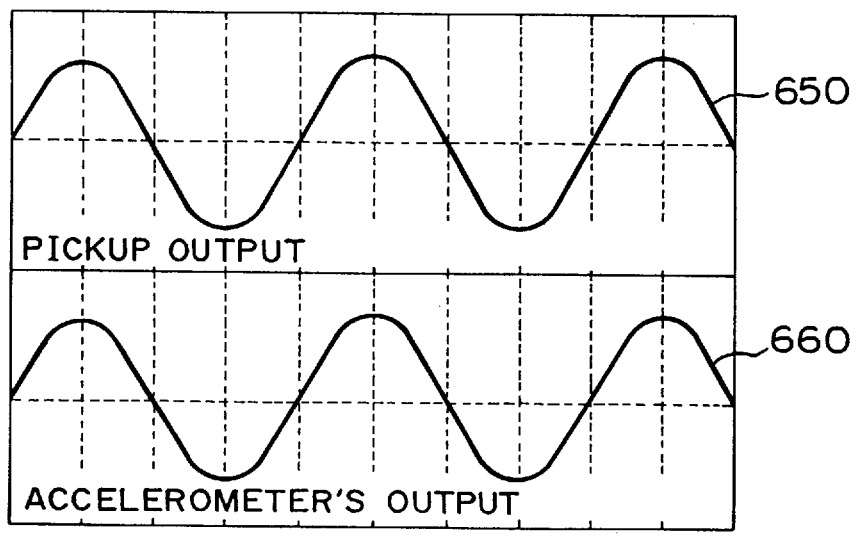
FIG. 3B is a wave form of the pickup output and the accelerometer output detected by the device shown in FIG. 3A.
Figure 4A:
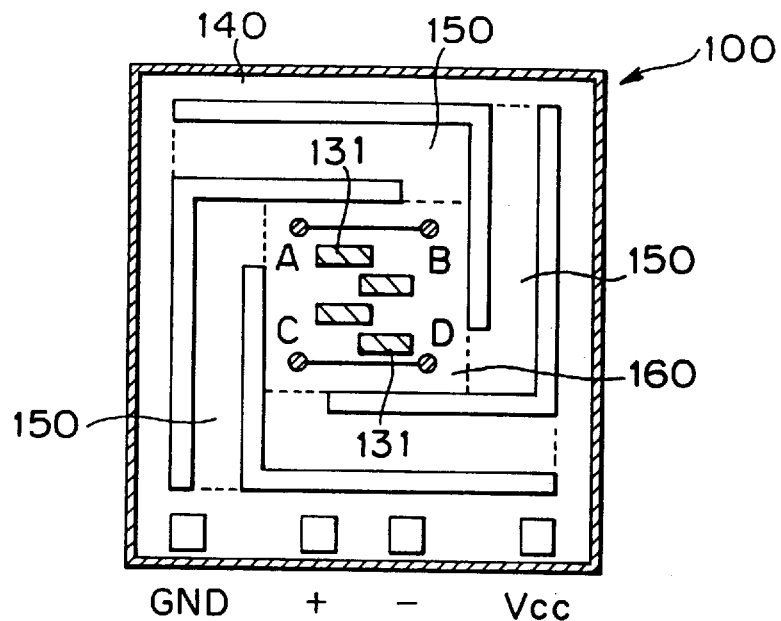
FIG. 4A is a schematic plan view of a first preferred embodiment of the semiconductor-type accelerometer in accordance with the present invention.
Figure 4B:
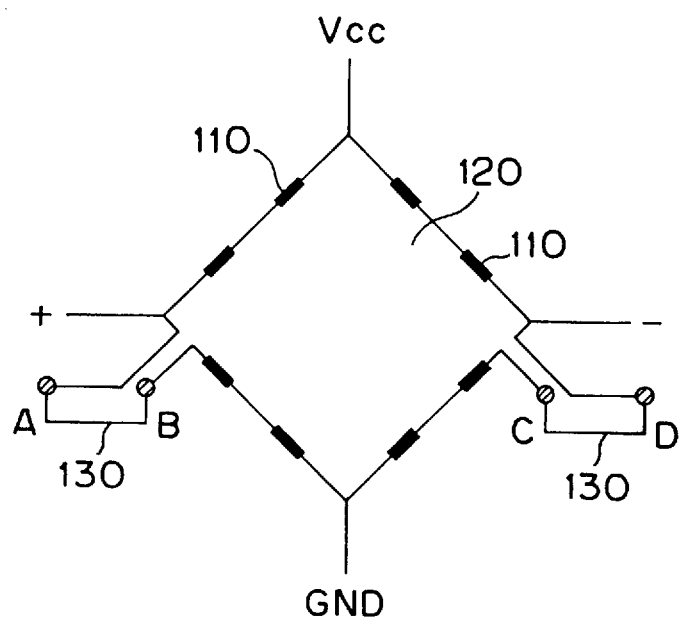
FIG. 4B is a circuit diagram of the first preferred embodiment of the semiconductor-type accelerometer in accordance with the present invention.

FIGS. 4A and 4B show an accelerometer as one of the preferred embodiments of the present invention, in which FIG. 4A is a schematic representation thereof and FIG. 4B is a circuit diagram thereof. In these figures, reference numeral 100 denotes an accelerometer element for detecting and measuring the relative movements of silicon mass 160, 110 denotes a semiconductor strain gauge, 120 denotes a Wheatstone bridge circuit, 130 denotes a diffusion electric wiring to be connected with diffusion resistors 131 for offset-regulation, 140 denotes a supporting frame, and 150 denotes a flexure. In the figures, furthermore, letters A, B, C, and D denote terminals in the bridge for regulating the offset, respectively, and also GND, Vcc, +, and − denote a grounding terminal, a current-applying terminal, a bridge-output terminal of a plus side, and a bridge-output terminal of an minus side, respectively.

In the accelerometer 100, as shown in FIG. 4B, the Wheatstone bridge circuit 120 is formed by the semiconductor strain gauges 110. In this embodiment, the diffusion electric wiring 130 is provided as a part of the Wheatstone circuit 120. In this example, as shown in FIG. 4B, the diffusion resistors 131 are not incorporated into the circuit 120. Therefore this kind of wiring pattern is for a condition in which there is no offset.

In this embodiment, furthermore, the four diffusion resistors 131 for the offset regulation are arranged in parallel so as to form a staggered arrangement.

<EXAMPLE 2>

Figure 5A:
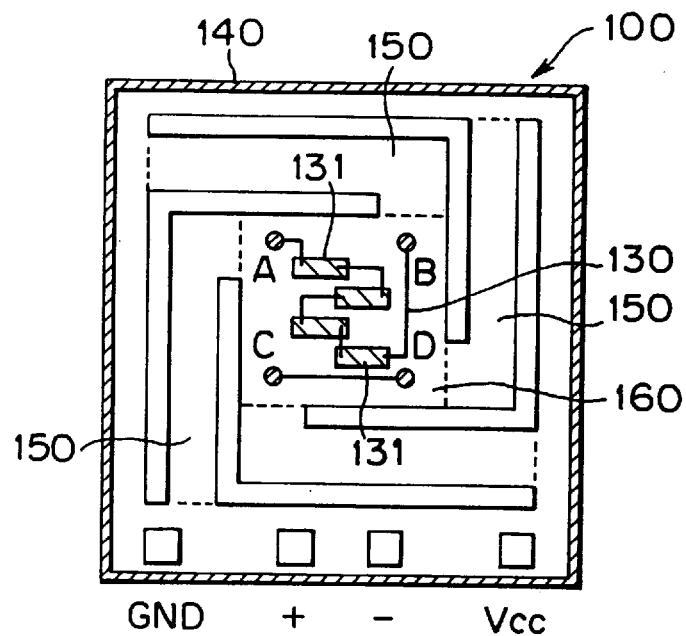
FIG. 5A is a schematic plan view of a second preferred embodiment of the semiconductor-type accelerometer in accordance with the present invention.
Figure 5B:
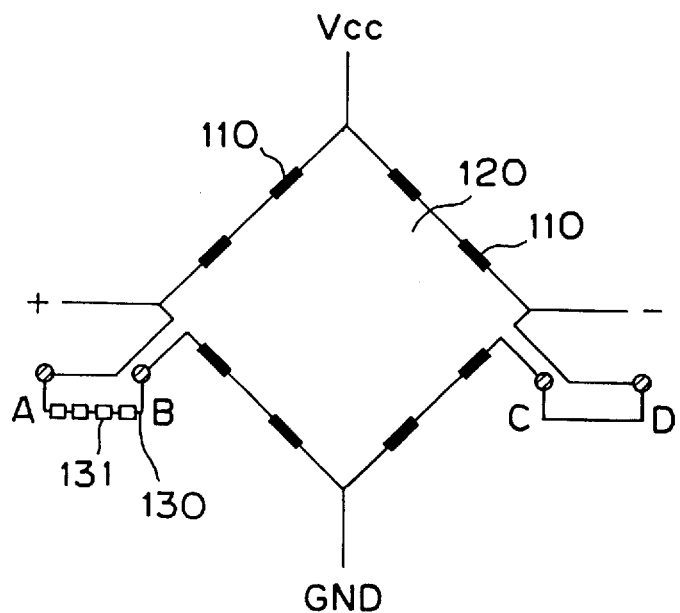
FIG. 5B is a circuit diagram of the second preferred embodiment of the semiconductor-type accelerometer in accordance with the present invention.

FIGS. 5A and 5B show another preferred embodiment of the accelerometer in accordance with the present invention, in which FIG. 5A is a schematic representation thereof and FIG. 5B is a circuit diagram thereof. In the accelerometer 100, as in the case of the first embodiment, the Wheatstone bridge circuit 120 is formed by the semiconductor strain gauges 110 and the diffusion electric wiring 130 is provided as a part of the Wheatstone circuit 120. In addition, as distinct from the first example, the diffusion resistors 131 are incorporated into a path between the terminals A and B of the circuit 120 as shown in FIG. 5B. Therefore this kind of wiring pattern is for effectively dealing with the offset mostly caused on the minus side of the bridge. A predetermined number of resistors 131 are placed in series between a plus-sided output end (+) and a ground connection end (GND) so as to regulate the offset to almost zero point.

For the regulation of the offset to almost zero point by means of the offset-regulating diffusion wiring 130, it is preferable that the offset-regulating diffusion resistors may be selected for canceling an initial offset which is previously confirmed by a pre-production test, prior to being placed in the bridge. At that time, it is preferable to keep several masks for patterning different wiring patterns in the semiconductor process for selecting the appropriate wiring to be incorporated in the bridge.

<EXAMPLE 3>

Figure 6A:
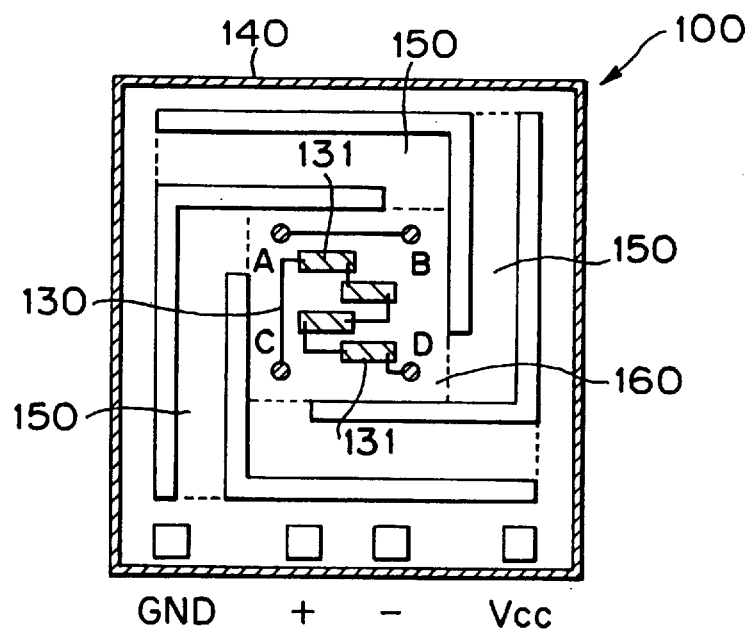
FIG. 6A is a schematic plan view of a third preferred embodiment of the semiconductor-type accelerometer in accordance with the present invention.
Figure 6B:
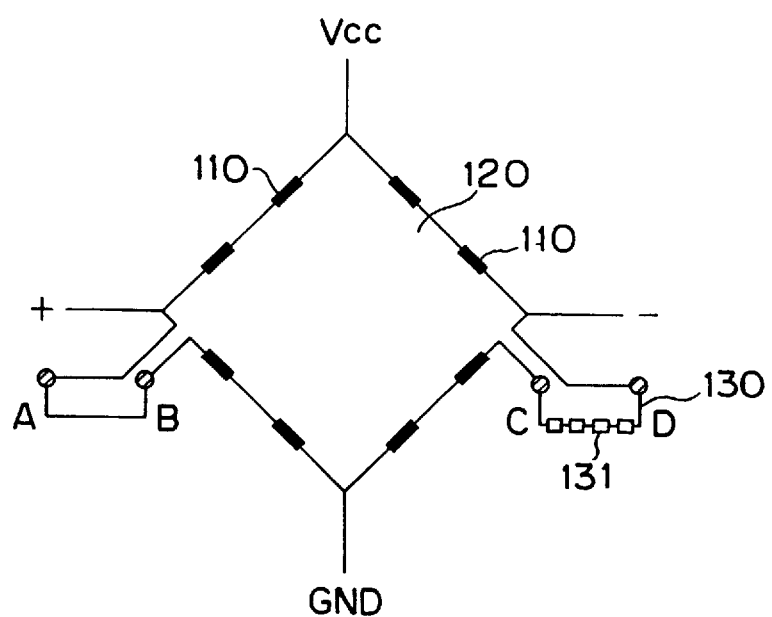
FIG. 6B is a circuit diagram of the third preferred embodiment of the semiconductor-type accelerometer in accordance with the present invention.

FIGS. 6A and 6B show a third preferred embodiment of the accelerometer in accordance with the present invention, in which FIG. 6A is a schematic representation thereof and FIG. 6B is a circuit diagram thereof. In the accelerometer 100, as in the case of the first embodiment, the Wheatstone bridge circuit 120 is formed by the semiconductor strain gauges 110 and the diffusion electric wiring 130 is provided as a part of the Wheatstone circuit 120. In addition, the diffusion resistors 131 are incorporated into a path between the terminals C and D of the circuit 120. A predetermined number of the resistors 131 placed in series between a minus-sided output end (−) and a ground connection end (GND) so as to regulate the offset to almost zero point. Therefore this kind of wiring pattern is for effectively dealing with the offset mostly caused on the plus side.

<EXAMPLE 4>

Figure 7A:
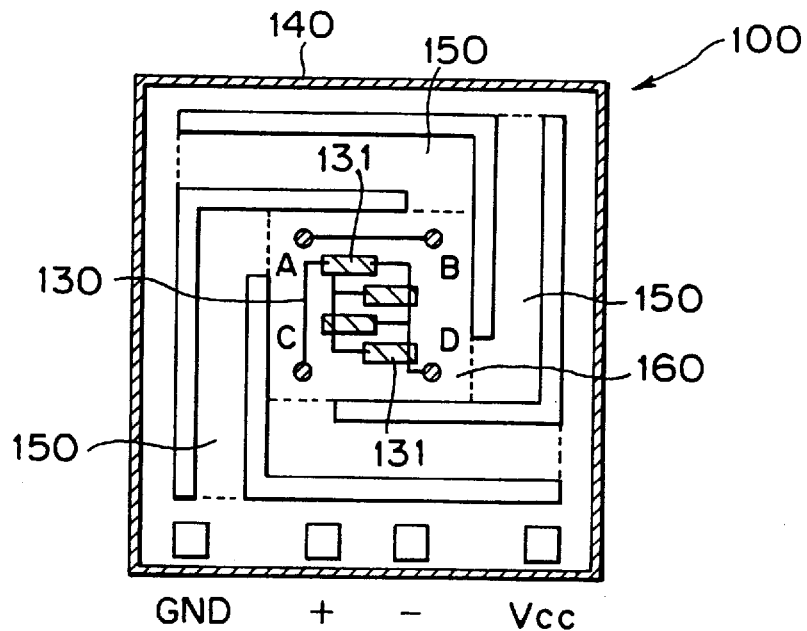
FIG. 7A is a schematic plan view of a fourth preferred embodiment of the semiconductor-type accelerometer in accordance with the present invention.
Figure 7B:
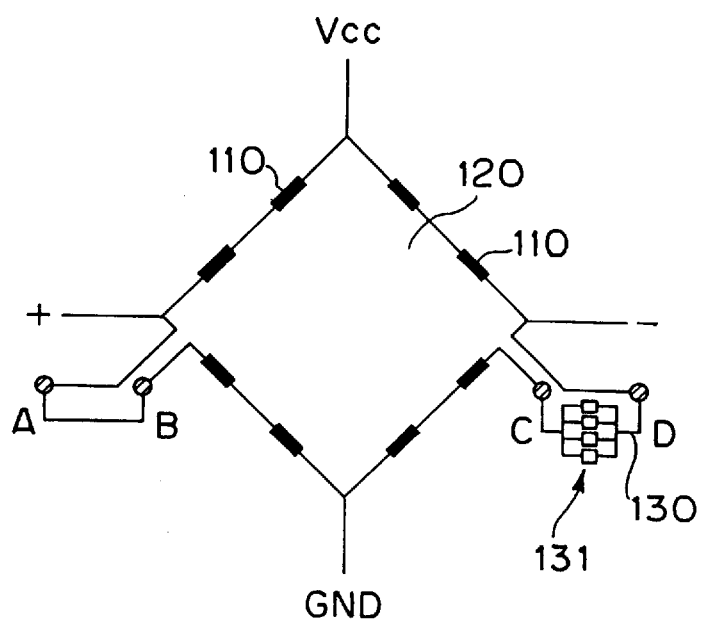
FIG. 7B is a circuit diagram of the fourth preferred embodiment of the semiconductor-type accelerometer in accordance with the present invention.

FIGS. 7A and 7B show a fourth preferred embodiment of the accelerometer in accordance with the present invention, in which FIG. 7A is a schematic representation thereof and FIG. 7B is a circuit diagram thereof. In the accelerometer 100, as in the case of the first embodiment, the Wheatstone bridge circuit 120 is formed by the semiconductor strain gauges 110 and the diffusion electric wiring 130 is provided as a part of the Wheatstone circuit 120. In addition, the diffusion resistors 131 are incorporated into a path between the terminals C and D of the circuit 120. A predetermined number of the resistors 130 are placed in parallel between a minus-sided output end (−) and a ground connection end (GND) so as to regulate the offset to almost zero point. Therefore this kind of wiring pattern is for effectively dealing with the offset slightly caused on the plus side.

Each of the above examples 1 to 3 can be easily attained by replacing one of aluminum wiring mask patterns used for the manufacturing process for the semiconductor accelerometer into one of four dispersion resistors for regulating the offset. In these examples, furthermore, the diffusion resistors for regulating the offset are dispersed in a staggered arrangement, so that any combinations of the aluminum wiring patterns can be attained. In the above examples 1 to 3, furthermore, it is also possible to perform a delicate adjustment of the offset by positioning the resistors in series or in parallel. Furthermore a drop in sensitivity of the accelerometer caused by incorporating the above wiring 130 for the resistors may be extremely small because each of the dispersion resistors has a resistance of several tens of ohms.

<EXAMPLE 5>

Figure 8:
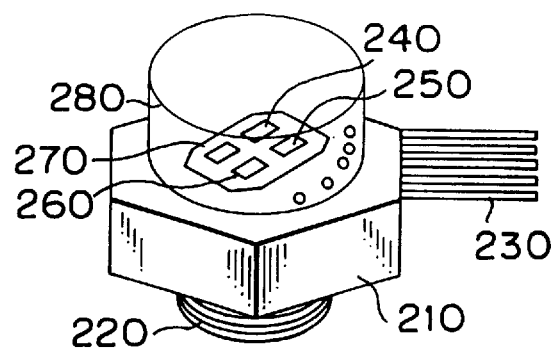
FIG. 8 is a perspective illustration of a semiconductor-type accelerometer in accordance with the present invention.
Figure 9:
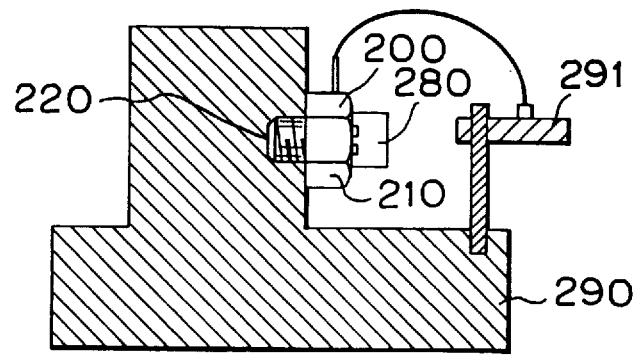
FIG. 9 is a sectional view of a sample under measurement, in which the semiconductor-type accelerometer of the present invention is installed thereon.

FIG. 8 is schematic representative view of another preferred embodiment of the accelerometer in accordance with the present invention, while FIG. 9 is a cross sectional view of the accelerometer of FIG. 8 with a sample under test. The sample is connected with the accelerometer of FIG. 9.

A package of the accelerometer 200 of the present invention comprises a base body 210 made of a firm material such as a metal and having a male thread 220 integrally formed on a bottom surface thereof; terminal ends 230 for signal-output, which are extended and insulated from the base body 210; a ceramic base plate 270 having a sensor element 240 formed on the base body, an amp-processing IC tip 250, and other peripheral elements 260; and a metal cap 280 for sealing these elements on the base body.

The accelerometer thus constructed is, as shown in FIG. 9, fixed on the sample 290 (for example, a detector portion of the automobile's air-bag system) by means of the male thread 220 and wired to the print circuit base plate 270 by means of the terminal ends 230. Therefore, the accelerometer precisely detects acceleration of the sample.

<EXAMPLE 6>

Figure 10:
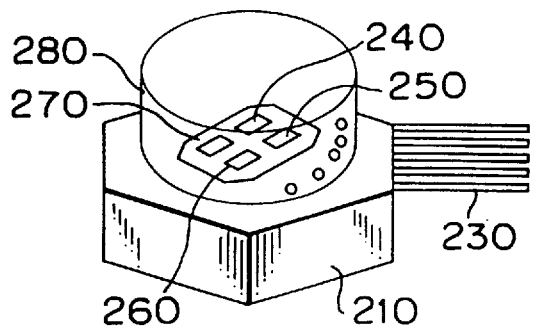
FIG. 10 is a perspective illustration of a semiconductor-type accelerometer in accordance with the present invention.
Figure 11:
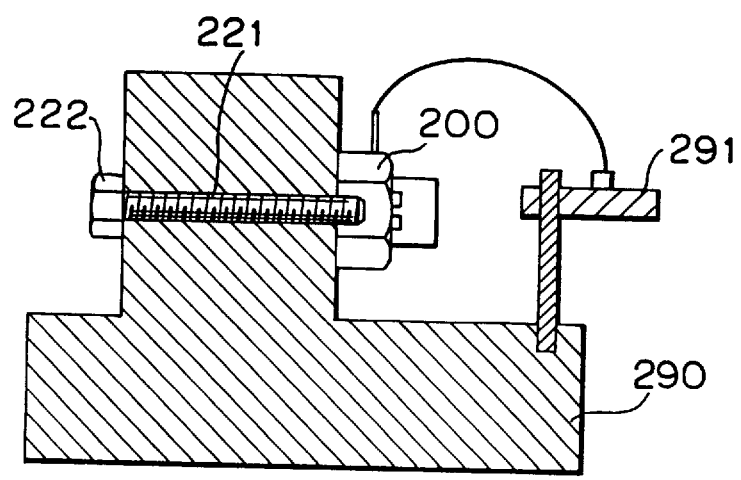
FIG. 11 is a sectional view of a sample under measurement, in which the semiconductor-type accelerometer of the present invention is installed thereon.

FIG. 10 is schematic representative view of another preferred embodiment of the accelerometer in accordance with the present invention, while FIG. 11 is a cross sectional view of a sample under test. The sample is connected with the accelerometer of FIG. 10.

A package of the accelerometer 200 of the present invention comprises a base body 210 made of a firm material such as a metal and having a female thread (not shown) integrally formed on a bottom surface thereof; terminal ends 230 for signal-output, which are extended and insulated from the base body 210; a ceramic base plate 270 having a sensor element 240 formed on the base body, an amp-processing IC tip 250, and other peripheral elements 260; and a metal cap 280 for sealing these elements on the base body.

The accelerometer thus constructed is, as shown in FIG. 11, fixed on the sample 290 (for example, a detector portion of the automobile's air-bag system) by means of a screw 222 having a male thread 221 and wired to the print circuit base plate 270 by means of the terminal ends 230. Therefore, the accelerometer precisely detects acceleration of the sample.

<EXAMPLE 7>

Figure 12A:
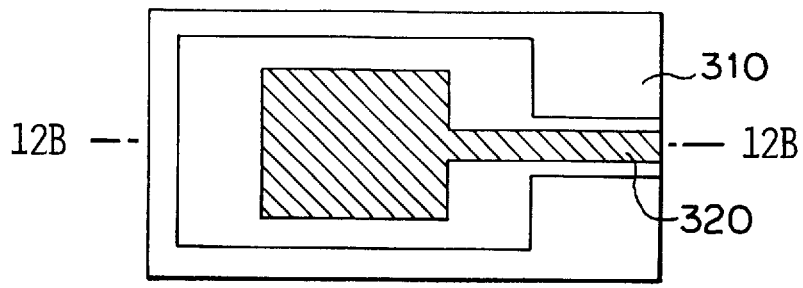
Figure 12B:
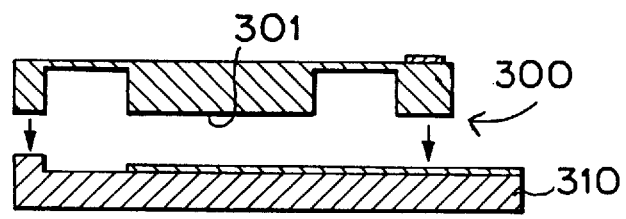
Figure 12C:
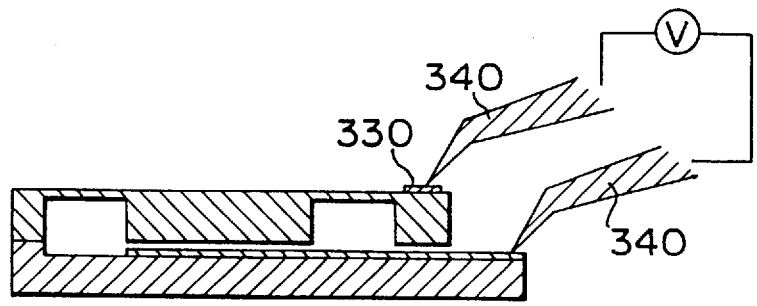
Figure 12D:
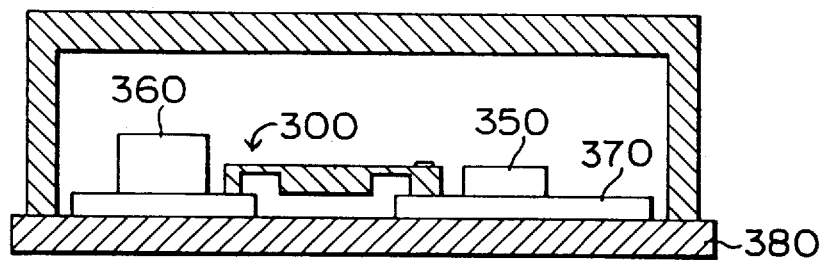

Referring now to FIGS. 12A to 12D, we will explain the method for making an assessment of the characteristics of the semiconductor accelerometer in accordance with the present invention. FIG. 12A is a schematic front view of the device for applying electrostatic force to the accelerometer; FIG. 12B is a cross-sectional view along the line 12B—12B and shows the condition just before attaching the accelerometer on the device for applying electrostatic force; FIG. 12C is a schematic sectional view of the accelerometer being fixed on the device for applying electrostatic force; and FIG. 12D is a schematic sectional view of the accelerometer being placed on the ceramic base plate after making the assessment of the characteristics thereof.

The device 310 for applying electrostatic force to the accelerometer is made of an electrical insulating material such as a glass and has a recess formed on a surface thereof and a terminal output end connected with the recess. A bottom surface of the recess is metalized by a metal thin film 320.

Performance evaluations on the accelerometer in accordance with the present invention can be conducted as follows.

First of all, the metal thin film 320 formed on the recess is fixed on the weight portion 301 of the sensor element 300, then a voltage is placed between the electrode pad 330 of the sensor element 300 and the metal thin film 320 of the device for applying electrostatic force. Consequently, an artificial acceleration of the sensor element 300 is caused by generating an electrostatic force between the weight portion 301 of the sensor element and the metal thin film 320. For making an assessment of the sensitivity of the sensor element by applying an electrostatic force enough to perform the predetermined acceleration, it is preferable to examine the correlation between the electrostatic force and the acceleration as preliminary examinations or the like. When the test is conducted with alternating current, it is possible to estimate not only the relationship between the electrostatic force and the sensitivity of the sensor but also the frequency characteristics and the natural oscillation thereof.

After making the above assessment, therefore, a sensor element with the properties of comparatively good sensitivity can be selected by the above process and installed on the ceramic base plate 370 together with the other elements such as the signal amplification IC 350, so that it is possible to avoid needless usage of the elements except the sensor 300 by sealing that elements with a package 380.

As described above, therefore, the semiconductor accelerometer of the present invention comprises a plurality of resistors responsible for adjusting the offset and a sensor element in which the resistors are placed in a staggered arrangement. This kind of accelerometer construction makes possible an easy combination of the wiring of the resistors in parallel or in series and to easily alternate such combination from one to another. Furthermore, the package for covering the sensor element has at least one connecting means for connecting with a sample under measurement, such as a male or female thread and a combination thereof, so that it is possible to connect the sample with the semiconductor accelerometer by the above connecting means. In accordance with the present invention, as a result, a semiconductor accelerometer with a reliable sensitivity and the possibility of mass production that results in a rapidly declining production cost can be manufactured. Furthermore, the method for conducting performance evaluations of the sensor element in accordance with the present invention is characterized by generating an electrostatic force as a result of causing direct or alternating current to flow between the sensor element and the metalized surface of the insulator, so that the properties of sensitivity, frequency, and the like of the sensor element can be easily estimated.

What is claimed is:

1. A semiconductor accelerometer, comprising:
   a sensor element having
      a support frame;
      a silicon mass;
      flexures connected to said support frame and said silicon mass;
      semiconductor strain gauges formed on said flexures, said strain gauges being integrally processed; and
      a staggered arrangement of diffusion resistors for adjusting an offset value variation;
   aluminum wiring connected with said strain gauges to form a Wheatstone bridge circuit; and
   a housing for covering said sensor element.

2. A semiconductor accelerometer as claimed in claim 1, wherein said housing has at least one portion connected to a sample under measurement.

3. A semiconductor accelerometer as claimed in claim 2, wherein
   said portion to be connected to a sample under measurement is one selected from a group of a male thread, a female thread, and a combination of said male thread and said female thread.

4. A semiconductor accelerometer as claimed in claim 1 wherein said diffusion resistors are connected in series with a semiconductor strain gauge forming an arm of said Wheatstone bridge, said diffusion resistors reducing said offset value variation.

5. A semiconductor accelerometer as claimed in claim 4 wherein said diffusion resistors connected in series with said semiconductor strain gauge are connected in series with each other.

6. A semiconductor accelerometer as claimed in claim 4 wherein said diffusion resistors connected in series with said semiconductor strain gauge are connected in parallel with each other.

7. A semiconductor accelerometer, comprising:
   a sensor element having
      a support frame;
      a silicon mass;
      flexures connected to said support frame and said silicon mass;
      semiconductor strain gauges formed on said flexures, said strain gauges being integrally processed; and
      a staggered arrangement of diffusion resistors;
   aluminum wiring connected with said strain gauges to form a Wheatstone bridge circuit; and
   a housing for covering said sensor element; wherein
   a sensitivity of said sensor element is evaluated using a device for applying electrostatic force which comprises an insulating material having a recess formed on a surface thereof, a metal thin film metalized on a surface of said recess, and a contact for taking an output from said metal thin film, said silicon mass of said sensor element being positioned so as to face toward said metalized portion and an alternating electric current being applied to flow between said sensor element and said metalized portion thereby generating an electrostatic force which produces an acceleration of said sensor element at the time of performing an evaluation of the sensitivity of said sensor element.

8. A semiconductor accelerometer, comprising:
   a sensor element having
      a support frame;
      a silicon mass;
      flexures connected to said support frame and said silicon mass;
      semiconductor strain gauges formed on said flexures, said strain gauges being integrally processed; and
      a staggered arrangement of diffusion resistors;
   aluminum wiring connected with said strain gauges to form a Wheatstone bridge circuit; and
   a housing for covering said sensor element; wherein
   frequency characteristics and a natural frequency of said sensor element are evaluated using a device for applying an electrostatic force which comprises an insulating material having a recess formed on a surface thereof, a metal thin film metalized on a surface of said recess, and a contact for taking an output from said metal thin film, said silicon mass of said sensor element being positioned so as to face toward said metalized portion and a direct electric current with a variation of frequency thereof being applied to flow between said sensor element and said metalized portion thereby generating an electrostatic force which produces an acceleration of said sensor element at the time of performing an evaluation of the frequency characteristics and natural frequency of said sensor element.

9. A semiconductor accelerometers, comprising:
   a sensor element having
      a support frame;
      a silicon mass;
      flexures connected to said support frame and said silicon mass;
      semiconductor strain gauges formed on said flexures, said strain gauges being integrally processed; and
      a staggered arrangement of diffusion resistors;
   aluminum wiring connected with said strain gauges to form a Wheatstone bridge circuit; and
   a housing for covering said sensor element; wherein
   a sensitivity of said sensor element is evaluated using a device for applying electrostatic force which comprises an insulating material having a recess formed on a surface thereof, a metal thin film metalized on a surface of said recess, and a contact for taking an output from said metal thin film, said silicon mass of said sensor element being positioned so as to face toward said metalized portion and a direct electric current being applied to flow between said sensor element and said metalized portion thereby generating an electrostatic force which produces an acceleration of said sensor element at the time of performing an evaluation of the sensitivity of said sensor element.

* * * * *